United States Patent [19]

Takahashi

[11] Patent Number: 4,833,620

[45] Date of Patent: May 23, 1989

[54] METHOD FOR FABRICATING A 1-CHIP MICROCOMPUTER

[75] Inventor: Hitoshi Takahashi, Kasugai, Japan

[73] Assignee: Fujitsu Limited, Kawasaki, Japan

[21] Appl. No.: 836,752

[22] Filed: Mar. 6, 1986

[30] Foreign Application Priority Data

Mar. 8, 1985 [JP] Japan .................................. 60-45808

[51] Int. Cl.⁴ ............................................ G06F 11/00
[52] U.S. Cl. .................................. 364/490; 364/489; 364/488; 357/40
[58] Field of Search ............... 364/488, 489, 490, 491, 364/200; 357/40; 437/8, 51, 52

[56] References Cited

U.S. PATENT DOCUMENTS

| | | | |
|---|---|---|---|
| 4,467,420 | 8/1984 | Murakami et al. | 364/200 |
| 4,513,400 | 4/1985 | Masaki | 365/240 |
| 4,670,838 | 6/1987 | Kawata | 364/200 |
| 4,688,070 | 8/1987 | Shiotari et al. | 357/40 |
| 4,701,886 | 10/1987 | Sakakibara et al. | 365/189 |

OTHER PUBLICATIONS

Patent Abstracts of Japan, vol. 9, No. 240 (E-345), 1963, 26th Sep. 1985; & JP-A-60 89 955 (Mitsubishi Denki K.K.), 05-20-1985.

Primary Examiner—Parshotam S. Lall
Assistant Examiner—V. N. Trans
Attorney, Agent, or Firm—Staas & Halsey

[57] ABSTRACT

A method for fabricating a 1-chip microcomputer accompanied by a so-called evaluation chip provided an interface for an external memory device in which a program to be written in a ROM of the 1-chip microcomputer is stored and evaluated in advance. The method includes producing masks for fabricating the chips of a 1-chip microcomputer and replacing ROM patterns in the masks by patterns for forming the interface means. Also included are the steps of adding patterns for additional bonding pads and wiring to the masks, where the additional bonding pads are arranged in an array at the outermost periphery of the evaluation chip, and the additional wiring connecting the additional bonding pads to the interface bonding pads which are formed at the inner region of the evaluation chip so as to have the same arrangement as in the corresponding 1-chip microcomputer chips. Patterns for the additional bonding pads and the connections to the additional bonding pads are usually added to the wiring patterns formed in the uppermost layer of a multiple-layer wiring configuration in the 1-chip microcomputer.

8 Claims, 5 Drawing Sheets

METHOD FOR FABRICATING A 1-CHIP MICROCOMPUTER

BACKGROUND OF THE INVENTION

1. Field of the Invention

The present invention relates to a 1-chip microcomputer and, in particular, to a chip referred to as an evaluation or test chip which is used for evaluating or testing a program built into a 1-chip microcomputer to be mass-produced.

2. Description of the Related Art

Microcomputers have been used for controlling the operations of various industrial equipment and consumer appliances. Generally, the microcomputer for these applications is a 1-chip microcomputer in which devices including logic circuits and memory devices are integrated on a single semiconductor chip. Such a 1-chip microcomputer includes a ROM (Read Only Memory) for storing a program under which the operation of the microcomputer is controlled. The program is developed according to the functions provided for the equipment and so forth, therefore, it is different for each user of the 1-chip microcomputer. Unless an EPROM (Erasable Programmable ROM) is employed in a 1-chip microcomputer, the program must be completely debugged and subjected to functional tests in advance, since it can not be modified once it is written into the ROM.

It is necessary that the functional tests must be performed in a comprehensive system environment including the 1-chip microcomputer and the controlled equipment therefore, the evaluation or test chip is prepared in advance. The evaluation chip is usually fabricated based on the design of a 1-chip microcomputer to be mass-produced, where an external memory device is used as a substitute for the ROM for permanently storing the program. Thus, the program can be subjected to modifications as many times as is required according to the results of the functional tests. To provide access to the external memory device, the evaluation chip is provided with an interface circuit including an address output buffer and data input buffer. The configuration of a conventional evaluation chip will be explained in the following discussion in comparison with that of a chip of the corresponding 1-chip microcomputer to be mass-produced.

FIG. 1 is a schematic plan view of an exemplary arrangement of circuits formed in a chip 20 of a 1-chip microcomputer, the circuits include a RAM (Random Access Memory), registers REG, logic circuits LOGIC, a clock generator CLK, an instruction programmable logic array IPLA, a program counter PC and a ROM. When the ROM receives an address signal from the program counter PC, the ROM outputs corresponding data or an instruction stored therein to the logic array IPLA. In FIG. 1, these circuits are represented as the respective regions set aside for them on the chip 20 in FIG. 1 and will be represented so in the following drawings. Also in FIG. 1, only the connections 22 and 23 relevant to the respective transmission of the address and data signals are illustrated. Generally, the data consists of eight bits in parallel, but the number of the address bits differs depending on the capacity of the ROM; 10 bits for a ROM of 1K bits, for instance. Further, a number of bonding pads 21, which are referred to as first bonding pads hereinafter, are formed at the periphery of the chip 20. The first bonding pads 21 are usually arranged in an array surrounding the circuits. Each of the first bonding pads 21 is connected to one of the circuits with corresponding wiring (not shown). The first bonding pads 21 are disposed at a constant pitch due to the general requirement for automatic bonding machines.

FIG. 2 is a schematic plan view of an exemplary configuration of a conventional evaluation chip for the 1-chip microcomputer shown in FIG. 1. Referring to FIG. 2, the evaluation chip 30 has an extended area around an inner area indicated by a dot-dash line. The inner area is referred to as a device area hereinafter, in which circuits the same as in the 1-chip microcomputer of FIG. 1, except for the ROM, are formed. The arrangement of these circuits in the device area is substantially the same as in the 1-chip microcomputer shown in FIG. 1. The bonding pads 31 corresponding to the first bonding pads 21 in FIG. 1 are formed in the extended area instead of in the device area and are connected to the facilities via not-shown wiring lines. In the evaluation chip 30, the region set aside for the ROM of the 1-chip microcomputer is blank, and an address output buffer 34 and a data input buffer 35 are provided in the extended area of the chip 30 instead. The region 36 is referred to as a ROM region hereinafter. The address output buffer 34 and data input buffer 35 are connected to the PC and the IPLA, respectively, via the respective wiring lines 32 and 33 and allow the evaluation chip to have access to an external memory device for storing the program to be evaluated.

Thus, the masks for fabricating the evaluation chip can be produced based on the existing masks prepared for the mass-production chips of the 1-chip microcomputer, where the required additions include patterns necessary for forming the buffers 34 and 35 and the wirings 32 and 33 added to respective corresponding ones of the existing masks and which provide some modifications in the arrangement of the bonding pads 31 and the connections between the bonding pads 31 and the circuits in the device region.

It is necessary that the circuits in the evaluation chip be tested and found good prior to the evaluation of the program. This requirement is satisfied in an evaluation chip of a 1-chip microcomputer which has already been used in the field. However, when a 1-chip microcomputer is newly developed, either one of a preliminary mass-production chip or an evaluation chip is fabricated in advance for the purpose of the confirmation testing. In other words, if either chip has been fabricated, the development of the other chip can be carried out based on the design of the previous chip.

Referring to FIG. 1, since the ROM has no external connections, no spare bonding pads occur because of the omission of the ROM in the evaluation chip 30. As a result, in FIG. 2, the bonding pads 31 include incremental or additional pads 310 for connecting the buffers 34 and 35 to the external memory device (not shown). The total number of the incremental bonding pads 310 is 18, for example. To accommodate the additional patterns for the incremental bonding pads and the address output and data input buffers, the evaluation chip 30 is generally designed to have an extended area compared with the mass-production chip of FIG. 1.

As described before, the circuits formed in the device area are arranged and interconnected with each other substantially in the same way as in the 1-chip microcomputer shown in FIG. 1. However, the pads 31 and 310 must be disposed with a constant pitch because of the reason mentioned above. Therefore, when the total number of bonding pads 31 is increased due to the addition of the incremental pads 310, the relative arrangement of the pads 31 to the circuits can not remain as in the production 1-chip microcomputer. This means that the modification in the masks for fabricating the conventional evaluation chip is not limited to the addition of the buffers 34 and 35 together with the incremental bonding pads 310 and wiring lines 32 and 33, but involves a comprehensive redesign in of the wiring pattern for connecting the bonding pads 31 to the circuits.

Such a redesign for the number of complicated wiring lines necessary inevitably results in a time consuming procedure and can cause an erroneous connection which makes not only the evaluation chip but the wiring masks useless. Moreover, the conventional evaluation chip must be designed to have a margin for the chip area thereof so as to permit the wirings 32 and 33 to be distributed without intersecting the existing wirings. When the margin is already provided in the mass-production chips, the chip area utilization efficiency is decreased. On the other hand, when the layout in the mass-production chip is optimized and the margin must be afforded in the evaluation chip, the redesign in the wiring pattern inevitably becomes further complicated.

SUMMARY OF THE INVENTION

It is an object of the present invention to provide an efficient fabrication method for an evaluation chip of a 1-chip microcomputer.

It is another object of the present invention to provide a reliable designing method for an evaluation chip.

More specifically, it is an object of the present invention to provide a fabrication method for an evaluation chip of a 1-chip microcomputer, the method allowing the simplification of the distribution of wiring on the evaluation chip, the elimination of erroneous connections in the wiring and enhancement of the chip area utilization efficiency.

The above objects can be achieved by a method for fabricating an evaluation chip for a 1-chip microcomputer to be mass-produced, the method being summarized as follows. An extended area is provided around a device area for a 1-chip microcomputer, the device area containing the circuits, except a ROM, and first bonding pads arranged in an array at the periphery thereof and connected to the circuits. An interface is formed in a region set aside for the ROM in the device area, the interface allowing the evaluation chip to have an access to an external memory device. Second bonding pads equal in number to the connections necessary for connecting thereto the corresponding first bonding pads and the interface are provided at the periphery of the extended area. The second bonding pads are arranged in an array with a substantially constant pitch and additional wiring lines are provided for connecting the first bonding pads and the interface to the corresponding second bonding pads. When multiple-layer wiring technology is employed in the evaluation chip, the second bonding pads and the wiring lines connected to the second bonding pads are formed from the uppermost wiring layer.

BRIEF DESCRIPTION OF THE DRAWINGS

These and other objects together with advantages of the present invention will be apparent from a reading of the following description of the disclosure with reference to accompanying drawings, forming a part of this application, in which.

DESCRIPTION OF THE PREFERRED EMBODIMENTS

Figure 1:
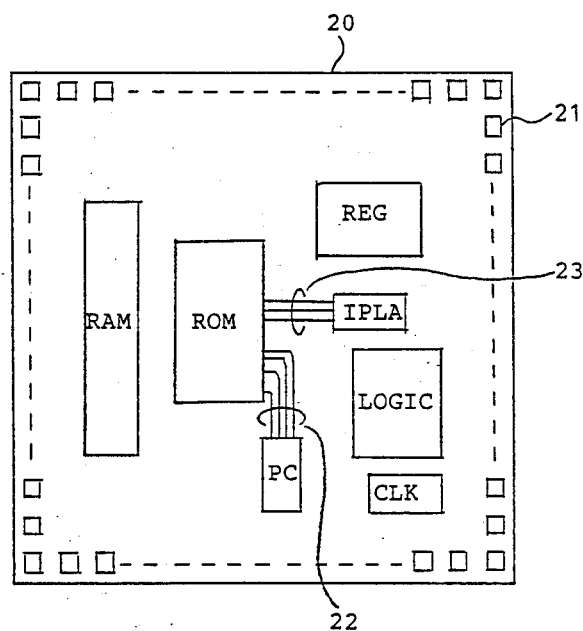
FIG. 1 is a schematic plan view of an exemplary arrangement of patterns formed in a chip of a 1-chip microcomputer.
Figure 3:
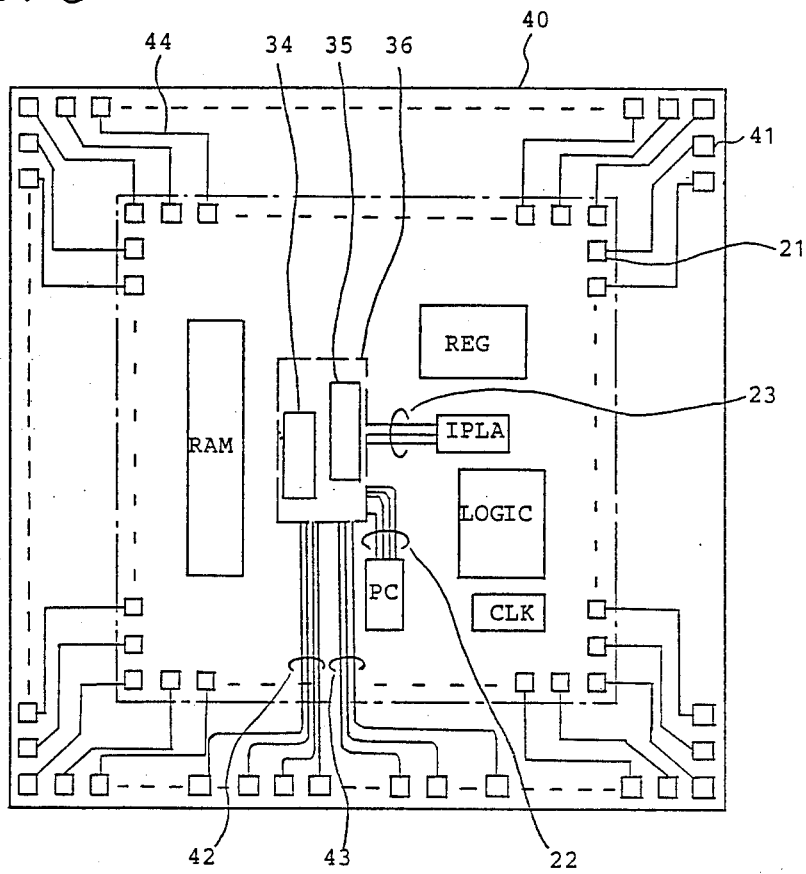
FIG. 3 is a schematic plan view of an exemplary arrangement of patterns formed on an evaluation chip in accordance with a first embodiment of the present invention.

FIG. 3 is a schematic plan view of an exemplary arrangement of patterns formed on an evaluation chip in accordance with a first embodiment of the present invention. Referring to FIG. 3, chip 40 of a semiconductor substrate has circuits including a RAM, registers REG, logic circuits LOGIC, a clock generator CLK, an instruction programmable logic array IPLA, and a program counter PC, all the same as in a corresponding 1-chip microcomputer, except for a ROM to be formed in the region 36. These circuit are arranged in a device area, which is enclosed by a virtual dot-dash line, and interconnected with each other with wiring lines not shown except for wiring lines and 23. Some of the circuits are connected to the first bonding pads 21 formed at the periphery of the device area with wiring lines not shown. The pattern of the interconnections among the circuits and the respective connections between the some of the circuits and the first bonding pads 21 are the same as in the corresponding 1-chip microcomputer as shown in FIG. 1. The chip 40 is also provided with an extended area around the device area.

Figure 2:
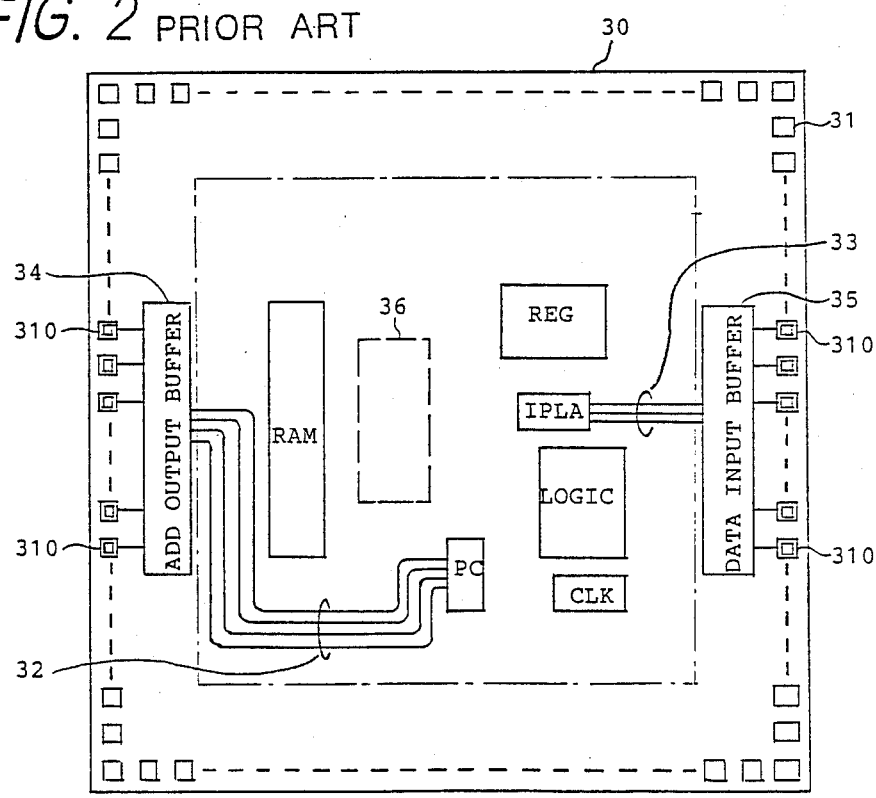
FIG. 2 is a schematic plan view illustrating an exemplary arrangement of patterns formed on a conventional evaluation chip for the 1-chip microcomputer as shown in FIG. 1.

Different from the prior art as shown in FIG. 2, the address output buffer 34 and data input buffer 35 are formed in the ROM region 36. The inputs of the address output buffer 34 are connected to the program counter PC with wiring lines (a bus line) 22 and the outputs of the data input buffer 35 are connected to the instruction programmable logic array IPLA with wiring lines (a bus line) 23. The wiring lines 22 and 23 are formed in the same way as in the 1-chip microcomputer of FIG. 1. At the periphery of the extended area, there are provided second bonding pads 41 which have a total number more than the number of first bonding pads 21 by the number necessary for the connections to the wiring lines 22 and 23. The second bonding pads 41 are disposed with a substantially constant pitch so as to comply with the manufacturing requirement mentioned previously. Most of the second bonding pads 41 are connected to the first pads 21, usually the respective nearest ones, with corresponding wiring lines 44 and remaining pads 41 are connected to the outputs of the address output buffer 34 and the inputs of the data input buffer 35 with respective wiring lines (bus lines) 42 and 43. Thus, the first bonding pads 21 and the corresponding second bonding pads 41 can be interconnected with relatively short and simple wiring lines 44.

According to the configuration shown in FIG. 3, patterns for the circuits and wiring in a 1-chip microcomputer can be used for producing masks for the corresponding evaluation chip, except for those relevant to a ROM. In other words, the evaluation chip can be designed by only replacing the ROM pattern in each of the masks for the 1-chip microcomputer with respective patterns for forming address output and data input buffers and adding patterns for providing the second bonding pads and wiring connecting the second bonding pads to the buffers and the first bonding pads. Accordingly, the fabrication of an evaluation chip can be facilitated and provided with enhanced reliability as compared with the prior art method, as explained with reference to FIG. 2. Further, since the address output and data input buffers are formed in the ROM region 36 which is not utilized in the conventional evaluation chip as shown in FIG. 2, and the extended area around the device area can be as small as possible, as long as it can accommodate the second bonding pads and the wiring connected thereto. Thus, the present invention allows efficient use of the chip area.

Figure 4:
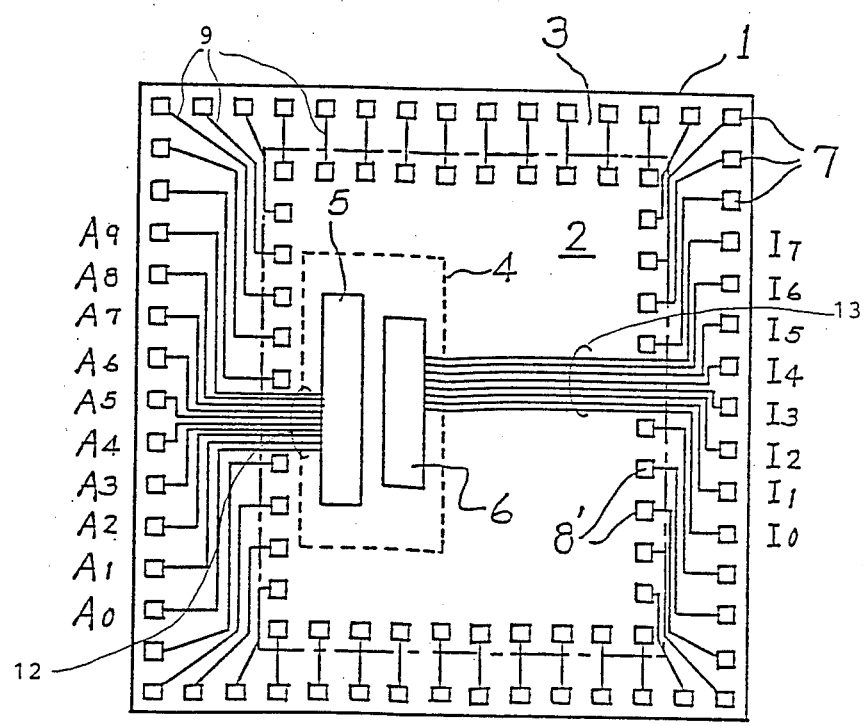
FIG. 4 is a schematic plan view illustrating an exemplary arrangement of patterns formed on an evaluation chip in accordance with a second embodiment of the present invention.

FIG. 4 is a schematic plan view illustrating an exemplary arrangement of patterns formed on an evaluation chip in accordance with a second embodiment of the present invention, wherein multiple-layer wiring technology is employed for the the second bonding pads and wiring connected thereto. In FIG. 4, only an address output buffer 5 and data input buffer 6, both formed in a region 4 on an evaluation chip 1, are shown and other circuits are omitted from the illustration for simplicity. The region 4 is set aside for the ROM in the corresponding mass-production chip. The address output and data input buffers 5 and 6 are connected to the respective groups of second bonding pads 7, including a group consisting of pads $A_0$ to $A_9$ and the other group consisting of pads $I_0$ to $I_7$ with wiring lines 12 and 13, respectively. The wiring lines for interconnecting the circuits (not shown) and first bonding pads 8' in a device area 2 enclosed by a dot-dash line are formed in the same way as in the corresponding mass-production chip. Each of the first bonding pads 8' is connected to the respective ones of the second bonding pads 7 with each corresponding wiring lines 9.

The multiple-layer wiring configuration eliminates the need for the area margin for distributing the wiring lines 12 and 13 in the device area, which margin might still be required in the embodiment of FIG. 3. Accordingly, the arrangement of the facilities and the pattern of wirings in the evaluation chip 1 of FIG. 4 can be the same as in the corresponding 1-chip microcomputer, and the second bonding pads 7 and wiring lines 9, 12 and 13 are only additions to the masks for the 1-chip microcomputer. Hence, the further efficient use of the chip area can be attained as well as a simplified pattern design and enhanced reliability for the wiring in the evaluation chip as achieved by the embodiment of FIG. 3.

Figure 5:
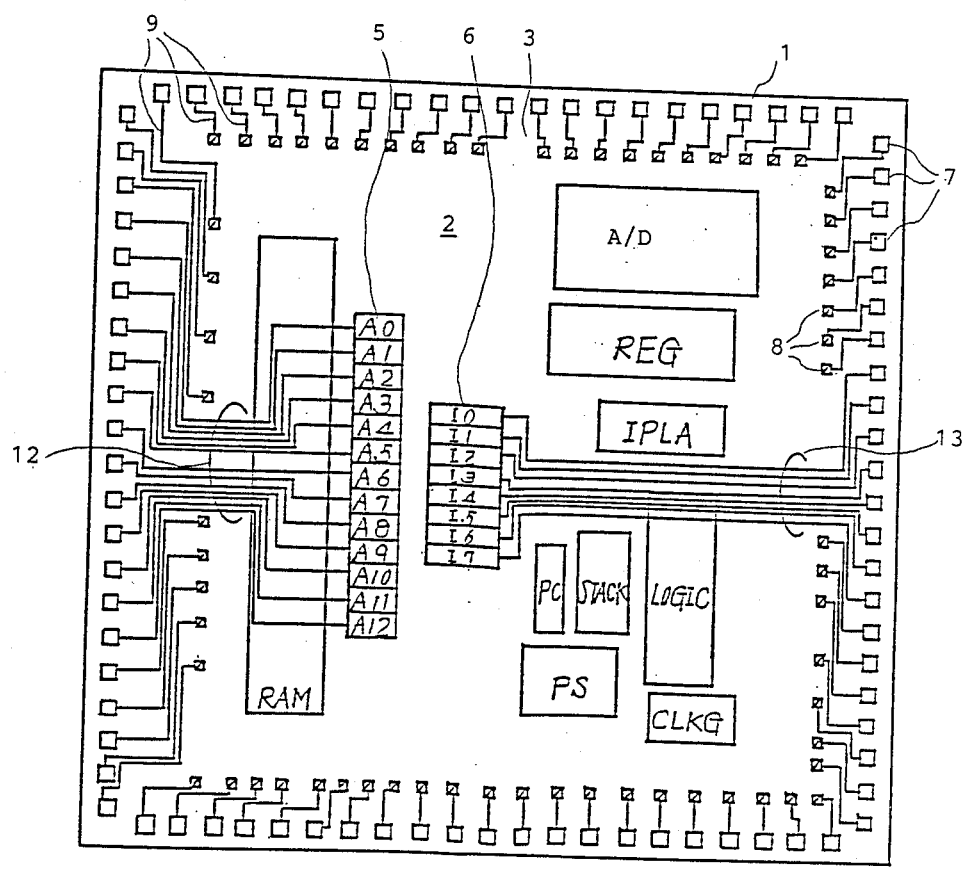
FIG. 5 is a schematic plan view illustrating a further detailed arrangement of patterns formed on an evaluation chip in accordance with a third embodiment of the present invention.

FIG. 5 is a schematic plan view illustrating a further detailed arrangement of patterns formed on an evaluation chip in accordance with a third embodiment of the present invention. In FIG. 5, like references numerals designate like or corresponding parts in FIG. 4. Referring to FIG. 5, additional circuits including a random access memory RAM, a analog-to-digital converter A/D, a stack register STACK and a prescaler PS are formed in a device area not indicated on an evaluation chip 1. The address output buffer 5 comprises elemental circuits $A_0$ to $A_{12}$ and the data input buffer 6 comprises elemental circuits $I_0$ to $I_7$. Each of these elemental circuits is connected to corresponding ones of second bonding pads 7 via respective corresponding ones the wiring lines 12 and 13.

In the fabrication of the evaluation chip of FIG. 4 or 5 using a multiple-layer wiring configuration, it is preferable to add the patterns of respective internal wiring of the address output buffer 5 and data input buffer 6 to a lower wiring layer which is selected to form therein internal the wiring of the circuits and the first bonding pads 8 and add patterns of the second bonding pads 7 and wiring lines 9, 12 and 13, all connected to the second bonding pads 7 to an upper wiring layer which is selected to form therein interconnections between the circuits. In a double-layer wiring configuration, the latter wiring layer is uppermost; however, when a multiple-layer wiring configuration of three or more layers is employed, it is preferable to use the uppermost wiring layer thereof for forming therein the second bonding pads 7 and the wiring lines 9, 12 and 13, all connected to the second bonding pads 7.

Figure 6A:
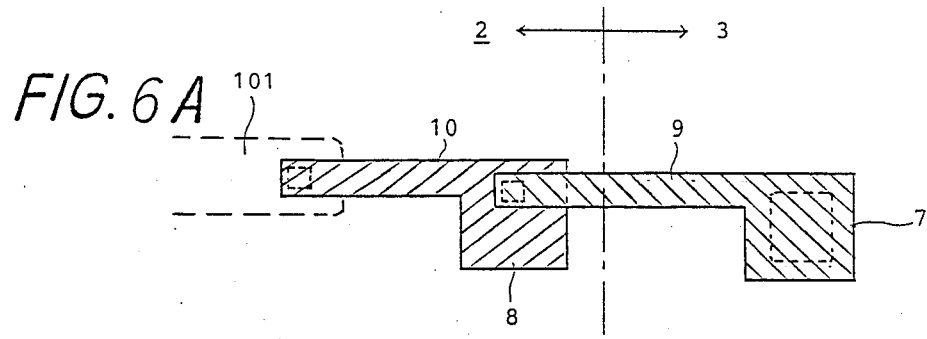
FIGS. 6A and 6B are a schematic partial plan view and cross-section of an evaluation chip fabricated according to the second or third embodiment, illustrating the first and second bonding pads and an interconnection therebetween.
Figure 6B:
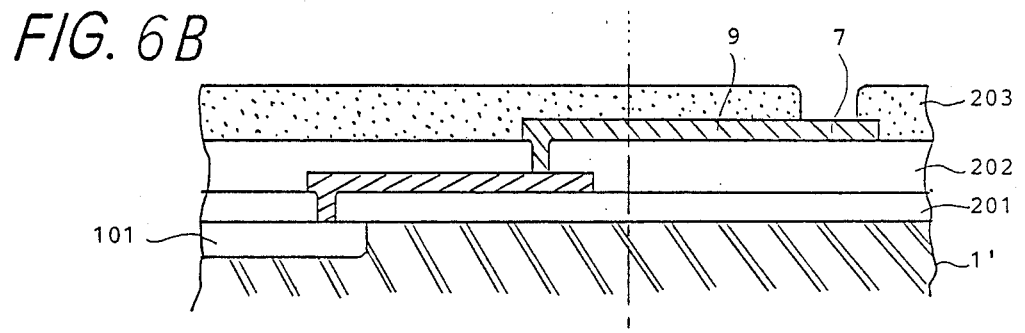

FIGS. 6A and 6B are a schematic partial plan view and cross-section of an evaluation chip fabricated according to the second or third embodiment, illustrating first and second bonding pads and wiring connected thereto, which are formed by using a double-layer wiring configuration. Referring to FIGS. 6A and 6B, the first bonding pad 8 and wiring line 10 connecting a diffusion region 101 to the first bonding pad 8 are formed from the lower layer of a double-layer wiring configuration. The diffusion region 101 formed in a semiconductor substrate 1' which constitutes the evaluation chip is a part of one of the circuits formed in the device area 2. The second bonding pad 7 formed at the extended area 3 of the evaluation chip and wiring line 9 interconnecting the first bonding pad 8 and the second bonding pad 7 are formed from the upper layer of the double-layer wiring configuration. The lower wiring layer is isolated from the substrate 1' by a dielectric layer 201. Another dielectric layer 202 is formed between the lower and upper wiring layers. The bonding pad 7 can be provided with an external connection through a window formed in a passivation layer 203.

Figure 7A:
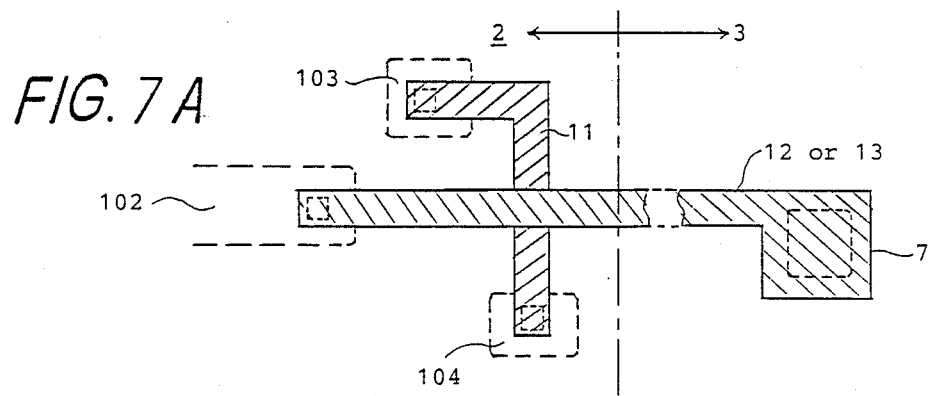
FIGS. 7A and 7B are a schematic partial plan view and cross-section of an evaluation chip fabricated according to the second or third embodiment, illustrating a second bonding pad and an interconnection between a buffer circuit and the second bonding pad.
Figure 7B:
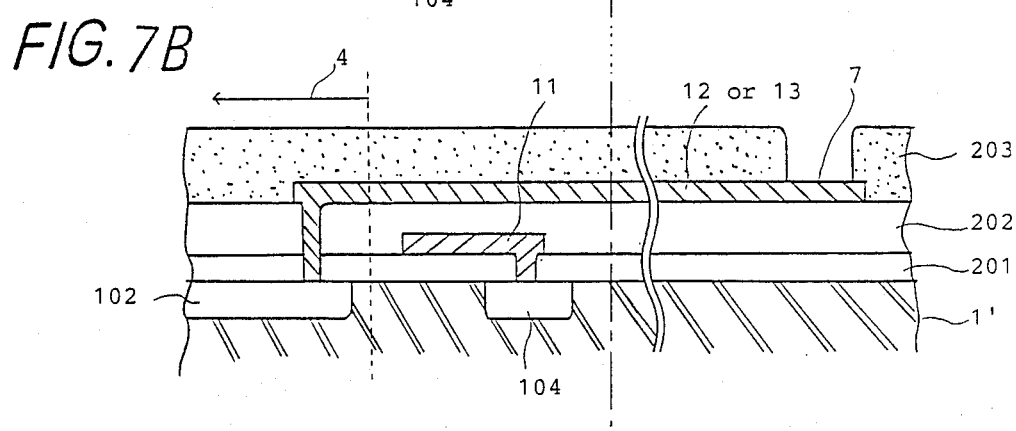

FIGS. 7A and 7B are a schematic partial plan view and a cross-section of an evaluation chip fabricated according to the second or third embodiment, illustrating a second bonding pad and two wiring leads formed by using a double-layer wiring configuration. In FIGS. 7A and 7B, the second bonding pad 7 formed in the extended area 3 of the evaluation chip is connected to a diffusion layer 102 formed in the device area 2 via wiring line 12 (13). The diffusion region 102 which is formed in a semiconductor substrate 1' constituting the evaluation chip is a part of a buffer circuit formed in the ROM region 4. The second bonding pad 7 and wiring line 12 (13) are formed from the upper layer of a double-layer wiring configuration. The wiring line 12 (13) intersects another wiring line 11 formed from the lower layer of the double-layer wiring configuration. The wiring line 11 is provided for interconnecting diffusion regions 103 and 104, each of which constitutes a respective part of the circuits formed in the device area 2. In the cross-section of FIG. 7B, the illustration of the diffusion region 104 and wiring 11 is not correct in a strict sense but intended for facilitating understanding. The wiring line 11 is isolated from the substrate 1' by a dielectric layer 201. The wiring lines 11 and 12 (13) are insulated each other by another dielectric layer 202. The second bonding pad 7 can be provided with an external connection through a window formed in a passivation layer 203. Thus, the respective wiring lines 12 and 13 for connecting the buffers 5 and 6 to the second bonding pads 7 in FIG. 4 or 5 can be distributed without causing a need for rearranging the circuits in the device area.

As described above, the present invention method allows to elimination of the need for modifications in the arrangement of the circuits and in the pattern of wirings interconnecting the circuits designed for the mass-production chips of a 1-chip microcomputer, when an evaluation chip is fabricated based on the mask patterns for the mass-production chips. The present invention simplifies the wiring for the external connections of the circuits and minimizes erroneous wiring in the evaluation chip, thereby enhancing the productivity and reliability in the fabrication of the evaluation chip. Further, these together with forming the interface for the external memory device in the ROM region permit increases in the area utilization efficiencies in both of the mass-production and evaluation chips.

I claim:

1. A method for fabricating a 1-chip microcomputer, comprising the steps of:
   (a) producing a first set of masks used for mass-producing chips of a 1-chip microcomputer, each of the masks having regions including patterns for forming first bonding pads and other circuits, a ROM region for later adding ROM patterns, and wiring patterns for connecting the other circuits to the ROM region, the first bonding pads being arranged in an array surrounding the other circuits;
   (b) fabricating the chip of the 1-chip microcomputer using the first set of masks;
   (c) producing a second set of masks for an evaluation chip, the evaluation chip being used for evaluating a program to be held in the ROM of each mass-production chip, said producing of the second set of masks comprising the steps of:
   (ci) adding interface patterns to the first set of masks in the ROM region for forming an interface allowing the evaluation chip to have access to an external memory device, the interface patterns substituting for the ROM patterns and including an address output buffer for transmitting address signals from the other circuits to the external memory device and a data input buffer for receiving data signals from the external memory device for the other circuits, and
   (cii) adding patterns to the first set of masks for forming second bonding pads and connection wiring lines between the second bonding pads and the first bonding pads, the address output buffer and the data input buffer in the interface, the second bonding pads being arranged in an array surrounding the array of the first bonding pads; and
   (d) fabricating the evaluation chip using the second set of masks with said interface being formed in the ROM region.

2. A fabrication method as recited in claim 1, wherein the evaluation chip includes multiple wiring layers, and step (cii) includes forming the second bonding pads and corresponding wiring connected thereto as an uppermost wiring layer and the remainder of the wiring as a lower wiring layer.

3. A fabrication method as recited in claim 1, wherein the second bonding pads and corresponding wiring connected thereto are formed in the first set of masks for forming the first bonding pads.

4. A fabrication method as recited in claim 1, wherein the step (cii) further includes arranging the second bonding pads connected to the address input and data output buffers to form respective groups at the periphery of the evaluation chip.

5. A fabrication method as recited in claim 1, wherein step (cii) includes forming an extended area around an area equivalent to the mass-production chip for forming therein the second bonding pads.

6. A fabrication method as recited in claim 1, wherein step (a) comprises producing masks with the patterns for forming the other circuits including patterns for forming a program counter connected to the address output buffer via the wiring patterns and a programmable logic array connected to the data input buffer via the wiring patterns.

7. A one-chip microcomputer evaluation chip using an external memory device during evaluation, said chip comprising:
   a one-chip microcomputer, comprising:
      one-chip microcomputer bonding pads on a periphery of said one-chip microcomputer;
      a programmable logic array;
      a program counter; and
      a ROM circuit area set aside for a read only memory, said ROM circuit area including an address output buffer, operatively connected to said program counter, for transmitting address signals to the external memory device and a data input buffer, operatively connected to said programmable logic array, for receiving data signals from the external memory device;
   a peripheral bonding pad area peripheral to said one-chip microcomputer bonding pads, said peripheral bonding pad area including:
   first bonding pads operatively connected to said one-chip microcomputer bonding pads; and
   second bonding pads operatively connected to said address output buffer and said data input buffer.

8. A chip as recited in claim 7, wherein said chip includes multiple wiring layers and the wiring of said one-chip microcomputer is in a first layer and the wiring connected to said first and second bonding pads is in a second layer higher than said first layer.

* * * * *